United States Patent
Yamamoto et al.

(10) Patent No.: US 7,896,050 B2
(45) Date of Patent: Mar. 1, 2011

(54) APPARATUS FOR CUTTING THE PROTECTIVE TAPE OF SEMICONDUCTOR WAFER

(75) Inventors: Masayuki Yamamoto, Ibaraki (JP); Yasuji Kaneshima, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 113 days.

(21) Appl. No.: 11/979,931

(22) Filed: Nov. 9, 2007

(65) Prior Publication Data
US 2008/0184855 A1   Aug. 7, 2008

(30) Foreign Application Priority Data
Nov. 14, 2006   (JP) .................... 2006-307727

(51) Int. Cl.
| | |
|---|---|
| B29C 65/00 | (2006.01) |
| B32B 37/00 | (2006.01) |
| B32B 38/04 | (2006.01) |
| B32B 38/10 | (2006.01) |
| H01B 13/00 | (2006.01) |
| H01L 21/00 | (2006.01) |

(52) U.S. Cl. ......... 156/522; 156/510; 156/523; 156/524; 156/525; 156/526; 438/113

(58) Field of Classification Search .................. 438/113; 156/353, 510, 522, 523, 524, 526
See application file for complete search history.

(56) References Cited

U.S. PATENT DOCUMENTS
| | | | |
|---|---|---|---|
| 6,258,198 B1 * | 7/2001 | Saito et al. ..................... | 156/229 |
| 2003/0062116 A1 * | 4/2003 | Lee ............................... | 156/249 |
| 2005/0072517 A1 * | 4/2005 | Yamamoto .................... | 156/250 |

FOREIGN PATENT DOCUMENTS
JP   2004-025438 A   1/2004

* cited by examiner

Primary Examiner — N Drew Richards
Assistant Examiner — Michael Jung
(74) Attorney, Agent, or Firm — Cheng Law Group, PLLC

(57) ABSTRACT

An outer edge of a protective tape projected from a semiconductor wafer is fixed and held by a tape holding section. In the condition, a part of the projected protective tape is caught and supported with a tape supporting section with a face having lower adhesive property provided in the outside of the traveling groove for the cutter. Furthermore, the part of the protective tape having the outer edge fixed and held with the tape holding section is compulsorily deformed and inserted into a depression provided between the tape holding section and the tape supporting section. Thereby, the part of the protective tape located in a traveling groove for the cutter is tensioned outward. A cutter blade is stuck into this tensioned part, and cuts the protective tape all over the peripheries of the wafer.

8 Claims, 12 Drawing Sheets

APPARATUS FOR CUTTING THE PROTECTIVE TAPE OF SEMICONDUCTOR WAFER

BACKGROUND OF THE INVENTION (1) Field of the Invention

The present invention relates to a method for cutting a protective tape applied on the surface of a semiconductor wafer that has been subjected to surface treatment, along with the periphery of the wafer, and relates to an apparatus for cutting the protective tape.

(2) Description of the Related Art

For example, JP-A No. 2004-25438 discloses a following method as a method for cutting a protective tape applied on the surface of a semiconductor wafer (hereinafter, referred to as "wafer" for short).

A protective tape is supplied on the surface of a wafer mounted and held on a chuck table, and then the protective tape is applied on the surface of the wafer by rotative travel of an application roller. Subsequently, the protective tape having a cutter blade stuck thereinto is rotated by rotation of the table (or the cutter blade is traveled), and thereby the cutter blade is rotated and traveled along with the periphery of the wafer. As a result, the protective tape is cut along with the periphery of the wafer.

In the above-described method, the protective tape projected around the wafer is held by applying to the chuck table, and the cutter blade is traveled in a condition that the cutter blade is stuck into the protective tape in the outer peripheral part of the wafer. However, the part of the protective tape projected around the wafer fails to give a stable degree of stretch. That is, cutting at a part having a weaker stretch of the protective tape may give wrinkles and wavy shape, and poor finish of the cut edge of the protective tape, leading to a defect of cutting resulting from disagreement of a starting position and an end position of cutting.

In the tape applying process, the protective tape is stretched in a comparatively stable condition in forward and backward directions of the travel of the application roller. However, in a transverse direction perpendicularly intersecting to the travel of an application roller, there may be shown a tendency of giving a weaker stretch. Therefore, poor finish easily occurs on the cut edge of the protective tape.

In order to cancel such defect, there may be introduced a tensioning device such as compulsory stretching in an outside direction by pinching with a clamp, etc. of the protective tape projecting around the semiconductor wafer. However, in this case, it is necessary to give a width larger than the chuck table to the protective tape in order to provide a part to be pinched of the protective tape. Therefore, the method possibly gives more amount of waste of the protective tape after cutting process, resulting in a disadvantage of higher running costs.

SUMMARY OF THE INVENTION

The present invention has been accomplished considering such actual circumstances. That is, the present invention aims at providing a method for cutting with high precision and accuracy all over the peripheries of a semiconductor wafer by giving a suitable stretch for the projected part of the protective tape applied on the semiconductor wafer, and aims at providing an apparatus for cutting the protective tape.

The present invention aims at providing a method for cutting a protective tape of a semiconductor wafer the method cutting, along with a contour of the semiconductor wafer, the protective tape applied on the surface of the semiconductor wafer, by mounting and holding the semiconductor wafer on a holding table provided with a traveling groove for a cutter, and by rotating a cutter blade stuck into the traveling groove along with a periphery of the semiconductor, the method comprising:

fixing an outer edge of the protective tape projected from the semiconductor wafer by a tape holding section;

catching a part of the projecting protective tape closer to the semiconductor wafer using a tape supporting section with a face having lower adhesive property, the tape supporting section being provided in an outside of the traveling groove for the cutter; and tensioning a part of the protective located in the traveling groove for the cutter outward, by compulsorily deforming and inserting a part of the protective tape with the outer edge fixed by the tape holding section into a depression for catching the tape provided between the tape holding section and the tape supporting section.

According to the method for cutting a protective tape of a semiconductor wafer, the outer edge of a part of the protective tape projected from the semiconductor wafer is compulsorily deformed and inserted into a depression in a condition being fixed to the tape holding section. Thereby, the part of the protective tape on the traveling groove for the cutter is stretched in an outside direction. That is, the protective tape can be subjected to cutting processing by the cutter blade in a condition free from either wrinkles or wavy shape.

When the protective tape is deformed and inserted into the depression, a pressure sensitive adhesive face of the protective tape will be pressed to the tape supporting section between the traveling groove for the cutter and the depression. However, since the surface of the tape supporting section has a face having lower adhesive property, displacement in an outside direction of the protective tape by drawing is not blocked.

Insertion of the tape to the depression is, for example, preferably performed as follows.

Application of a negative pressure to the depression deforms and inserts the protective tape into the depression.

According to this method, after application of the protective tape over the semiconductor wafer and the holding table fixes and holds the outer edge of the tape, application of the negative pressure to the depression deforms and draws the protective tape into the depression.

In an other example, the protective tape is deformed and inserted into the depression by a pressing member.

According to this method, after the protective tape is applied over the semiconductor wafer and the holding table, and the outer edge of the tape is fixed and held, the protective tape is deformed and inserted into the depression with the pressing member.

As an other example, traveling of a pressing roller in an annular depression may be mentioned.

According to this method, after the protective tape is applied over the semiconductor wafer and the holding table and the outer edge of the tape is fixed and held, the protective tape is pressed into the depression and deformed with the pressing roller. That is, stretching in an outside direction of a part of the protective tape on the traveling groove for the cutter can cancel wrinkles and wavy shape. The cutter blade is stuck into a tensioned part of the protective tape and rotated in a circumferential direction of the wafer, simultaneously the pressing roller is rotated following the cutter blade, and thus the cutter blade can always be made to work onto the tensioned part of the protective tape.

In this method, the pressing roller may also be traveled accompanied by deformation and drawing of the protective tape into the depression by application of a negative pressure to the depression.

In an other example, the depression is divided into a front part and a rear part in an applying direction of the tape, and into parts in width directions of the tape, and the amount of inserted protective tape in the width direction of the tape is set larger.

In any of the above-described examples, stretching in an outside direction of the part of the protective tape on the traveling groove of the cutter can eliminate the wrinkles and wavy shape.

The following configurations are also used for the present invention in order to achieve such objects, that is, an apparatus for cutting a protective tape of a semiconductor wafer,
the apparatus cutting, along with a contour of the semiconductor wafer, the protective tape applied on the surface of the semiconductor wafer,
by mounting and holding the semiconductor wafer on a holding table provided with a traveling groove for a cutter, and by rotating a cutter blade stuck into the traveling groove along with a periphery of the semiconductor,
the apparatus comprising:
a tape supporting section having a surface formed by a face having lower adhesive property, the tape supporting section being provided along with an outside of the traveling groove for the cutter in the holding table;
a depression for catching the tape being formed in an outside of the tape supporting section;
a tape holding section for holding and fixing the outer edge of the protective tape, the tape holding section being formed in an outside of the depression; and
a tape tensioning device for deforming and inserting a projected part in an outside direction of the protective tape applied on the semiconductor wafer into a depression.

According to this configuration, the method for cutting the protective tape of the invention can be suitably carried out.

This apparatus is preferably configured in the following manner.

For example, the tape tensioning device deforms and draws the protective tape into the depression, by negative pressure applied to the depression using connection of the depression with a suction unit.

In the case of this configuration, the depression is preferably formed by a plurality of sectioned depression divided into a plurality of sections in a circumferential direction so as to allow application of different negative pressures to each of the sectioned depressions.

A width or a depth of a section of the depression in the tape width direction is more preferably set wider or deeper than a width or a depth of the section in a transportation direction of the tape to give a larger inserted amount of the protective tape in the tape width direction.

According to this configuration, when a part having a looser stretch exists in the predetermined region in the circumferential direction of the semiconductor wafer, a negative pressure stronger than a negative pressure to other sectioned depression can be applied to the sectioned depressions belonging to this part. As a result, a uniform tension of the tape may be obtained all over the peripheries of the traveling groove for the cutter.

As an other embodiment, the tape tensioning device is provided with a pressing member disposed above the depression enabling free vertical movement, and thus descend of the pressing member deforms and inserts the protective tape into the depression.

In case of this configuration, for example, the depression has an annular form, and the pressing member is formed to give a ring stay shape to be inserted in the depression.

As an other embodiment, the tape tensioning device is freely vertically movable over the depression in the vicinity of the cutter blade, and the device is a pressing roller enabling rotating travel together with the cutter blade with respect to the holding table. The tape tensioning device lowers the pressing roller, and deforms and inserts the protective tape into the depression.

In any of the above-described examples, function of a suitable tension to the projected part of the protective tape applied on the semiconductor wafer can provide precise and accurate cutting of the tape all over the peripheries of the semiconductor wafer. Moreover, the above-described examples eliminate the necessity of using a tensioning device, such as drawing in the outside direction by pinching of an end rim of the tape, in giving a tension to the projected part of the protective tape applied on the semiconductor wafer.

That is, the amount of the projected part of the protective tape applied on the semiconductor wafer does not necessarily need to be set larger, leading to use of the protective tape having only a minimum width and length. Therefore, operation with the same running cost of the protective tape as that in the conventional operation may be attained, resulting in practical great effectiveness.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Hereinafter, the present invention will be described with reference to drawings.

Figure 1:
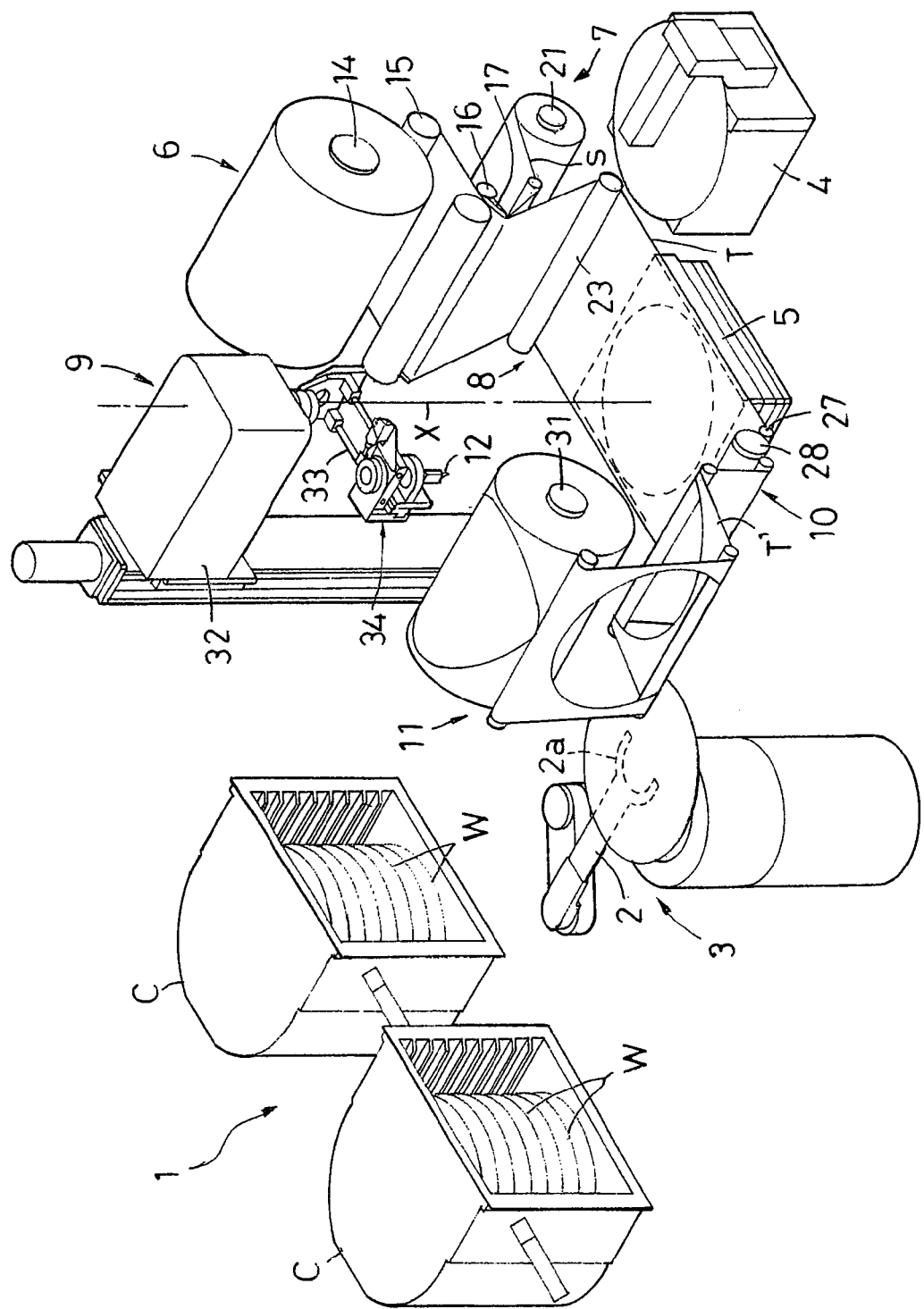
FIG. 1 is a perspective view illustrating a body of an apparatus for applying a protective tape.

FIG. 1 is a perspective view illustrating an entire configuration of an apparatus for applying a protective tape.

As illustrated in FIG. 1, this apparatus for applying a protective tape comprises:

a wafer feeding/collecting section 1 to be loaded with a cassette C for storing a semiconductor wafer (hereinafter abbreviated as "wafer" for short) W;

a wafer transport mechanism 3 provided with a robot arm 2;

an alignment stage 4;

a chuck table 5 for suction-holding the wafer W;

a tape feed section 6 for feeding a protective tape T for surface protection to the wafer W;

a separator collecting section 7 for separating and collecting a separator s from a protective tape T with a separator fed from the tape feed section 6;

an application unit 8 for applying the protective tape T to the wafer W mounted and suction-held in the chuck table 5;

an apparatus for cutting the protective tape 9 for cutting the protective tape T applied on the wafer W, along with a contour thereof;

a separating unit 10 for separating an unnecessary tape T' after applied and subsequently cut on the wafer W; and a tape collecting section 11 for rolling and collecting the unnecessary tape T' that has been separated with the separating unit 10, etc. Detailed configurations about each of the above-described structure and mechanism will be described hereinafter.

The wafer feeding/collecting section 1 can include two sets of cassettes C in parallel. Each cassette C stores a plurality of wafers inserted thereinto in multi-stage, and the wafers have a circuit-patterned side facing upward in a horizontal position.

The robot arm 2 mounted in the wafer transport mechanism 3 is configured to be movable forward and backward in a horizontal direction, and simultaneously the whole robot arm is rotatably movable, and vertically movable.

Furthermore, the end of the robot arm 2 has a horseshoe-shaped vacuum-suction type wafer holding section 2a. That is, the wafer holding section 2a is inserted into a clearance between the wafers W stored in the cassette C in multi-stage, and the wafer W is suction-held from the back side (underside). The suction-held wafer W is pulled out from the cassette C, and then transported in order of the alignment stage 4, the chuck table 5, and the wafer feeding/collecting section 1.

The alignment stage 4 is designed so as to perform position control of the wafer W that has been carried in and mounted by the wafer transport mechanism 3, based on a notch or an orientation flat that have been formed in the periphery of the wafer.

The chuck table 5 is designed so as to suck, with vacuum, the wafer W that has been transported from the wafer transport mechanism 3 and mounted with an attitude in a predetermined position control. Furthermore, on the top face of the chuck table 5, there is formed a traveling groove for the cutter 13 (refer to FIG. 3) for cutting the protective tape T by rotating travel of a cutter blade 12 of the apparatus 9 for cutting a protective tape mentioned later, along with the contour of the wafer W, and simultaneously at the center of the table there is provided a suction-holding section 5a (refer to FIG. 2) for loading and unloading and ascending and descending in taking in/taking out of the wafer. The chuck table 5 is equivalent to the holding table of the present invention.

A sheet feed section 6 is configured to guide the protective tape T having a separator delivered out from a delivering bobbin 14 by winding by a feed roller 15 and a guide roller 16 to a knife edge-like guide bar 17 for separation, turns back at an end edge of the separating guide bar 17 to separate the separator s, and then the protective tape T that has been separated from the separator s is guided to the application unit 8. The feed roller 15 guides the protective tape pinched between the pinch rollers 19 and the feed roller 15, and the feed roller 15 is rotated by a motor 18. That is, the feed roller 15 compulsorily delivers the protective tape T if needed. Furthermore, the delivering bobbin 14 is connected to an electromagnetic brake 20 for engaging movement. Therefore, the delivering bobbin 14 has a moderate rotation resistance, leading to prevention of excessive tape delivery.

The separator collecting section 7 has a collecting bobbin 21 for taking up the separator s that has been separated from the protective tape T. The collecting bobbin 21 rotates forward and backward, and is controlled by a motor 22.

The application unit 8 has an application roller 23 allowing vertical position variation with a cylinder (not illustrated). Furthermore, this whole unit is supported so as to allow horizontal travel along with the guiding rail 24, and is driven forward and backward in a screw feeding system with a screwed shaft 26 rotated forward and backward by a motor 25.

The separating unit 10 has a separating roller 27, and a motor-driven delivery roller 28. This whole unit is supported so as to allow horizontal travel along with the guiding rail 24, and is driven forward and backward in a screw feeding system with a screwed shaft 30 rotated forward and backward by a motor 29.

The tape collecting section 11 has a motor-driven collecting bobbin 31. Furthermore, the tape collecting section 11 is rotated in a direction allowing taking up of an unnecessary tape T' to the collecting bobbin 31.

Figure 8:
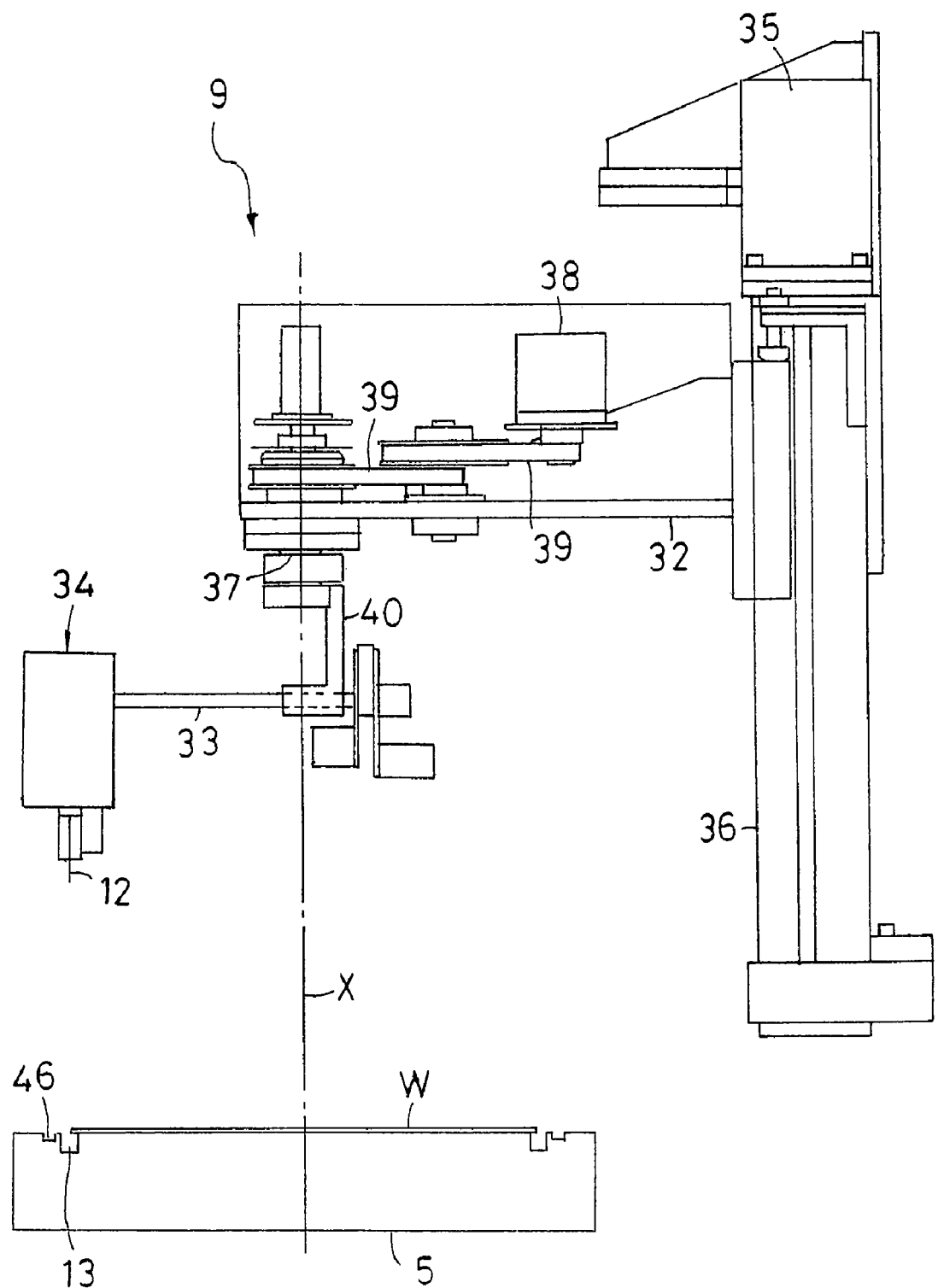
FIG. 8 is a front view of an apparatus for cutting the tape provided with a tape tensioning device of an example.

The apparatus 9 for cutting a protective tape has a support arm 33 that allow rotatable drive around a vertical axis center X located in the center of the chuck table 5, in the lower part of a vertically movable base 32. Furthermore, the cutter unit 34 by the free end side of the support arm 33 has the cutter blade 12 having a downward edge of a blade. Accordingly, rotation of the support arm 33 around the vertical axis center X drives the cutter blade 12 along with the periphery of wafer W and cuts the protective tape T. FIG. 8 illustrates the detailed configuration hereinafter.

The movable base 32 ascends and descends with screw thread feeding by reciprocal rotation of the motor 35 along with a longitudinal rail 36. A rotating shaft 37 rotationally provided around the vertical axis center X at the free end part of this movable base 32 is operatively connected to the motor 38 disposed on the movable base 32 through two belts 39 for deceleration. Thereby operation of motor 38 rotates the rotating shaft 37 in the predetermined direction at a low speed. The support arm 33 penetrates a bottom end of a support component 40 extending downward from this rotating shaft 37, and is supported therewith, allowing horizontally slidable adjustment. Accordingly, slide adjustment of the support arm 33 can change a distance of the cutter blade 12 from the vertical axis center X, thus enabling correction and adjustment of a turning radius of the cutter blade 12 corresponding to a diameter of the wafer.

In addition, although a detailed configuration is not illustrated, a bracket including the cutter blade 12 is supported for enabling slide movement in the longitudinal direction of the support arm 33 possible, and the bracket is slidably biased with a spring in a direction approaching the vertical axis center X.

Hereinafter, a series of elementary actions for application of the protective tape T onto the surface of the wafer W will be described with reference to FIGS. 3 to 7, using the apparatus of the above-described example.

When a command for application is issued, firstly the robot arm 2 in the wafer transport mechanism 3 moves to the cassette C that has been mounted in the cassette base 12. The wafer holding section 2a is inserted in a clearance between the wafers included in the cassette C. The wafer holding section 2a holds the wafer W with suction from the back side (underside) and takes the wafer out. The robot arm 2 transports the taken-out wafer W to the alignment stage 4.

The position of the wafer W mounted in the alignment stage 4 is adjusted using a notch or an orientation flat formed in the periphery of the wafer W. The wafer W after position adjustment is again taken out with suction by the robot arm 2, and is mounted in the chuck table 5.

Figure 2:
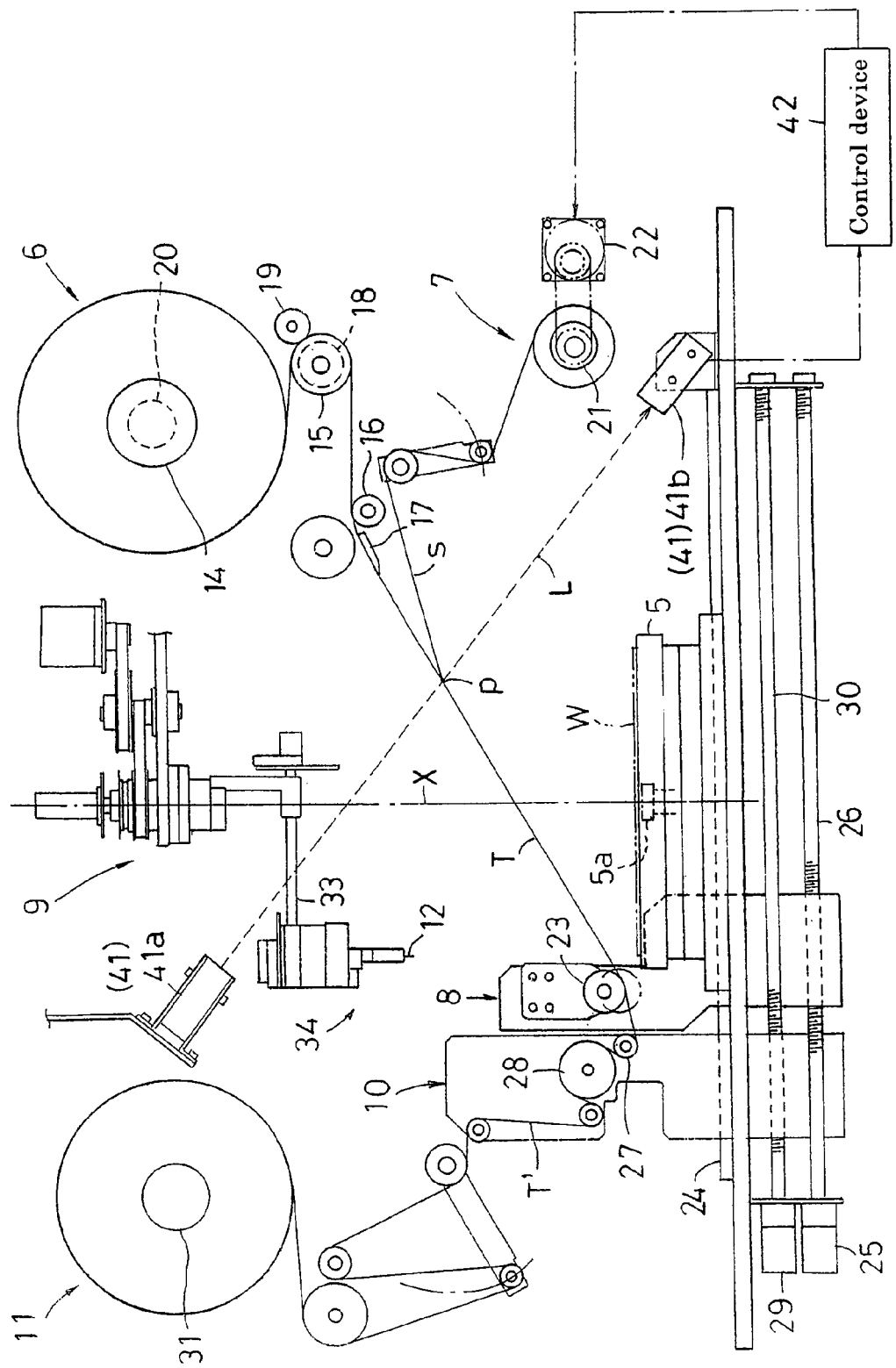
FIG. 2 is a front view of an apparatus for applying a protective tape.

The wafer W mounted on the chuck table 5 is suction-held with position adjustment for giving the center thereof coincident with the center of the chuck table 5. As illustrated in FIG. 2 at this time, the application unit 8 and the separating unit 10 are in the initial position in the left-hand side. The cutter blade 12 of the tape cutting mechanism 9 is in a waiting state in the upper initial position.

Figure 3:
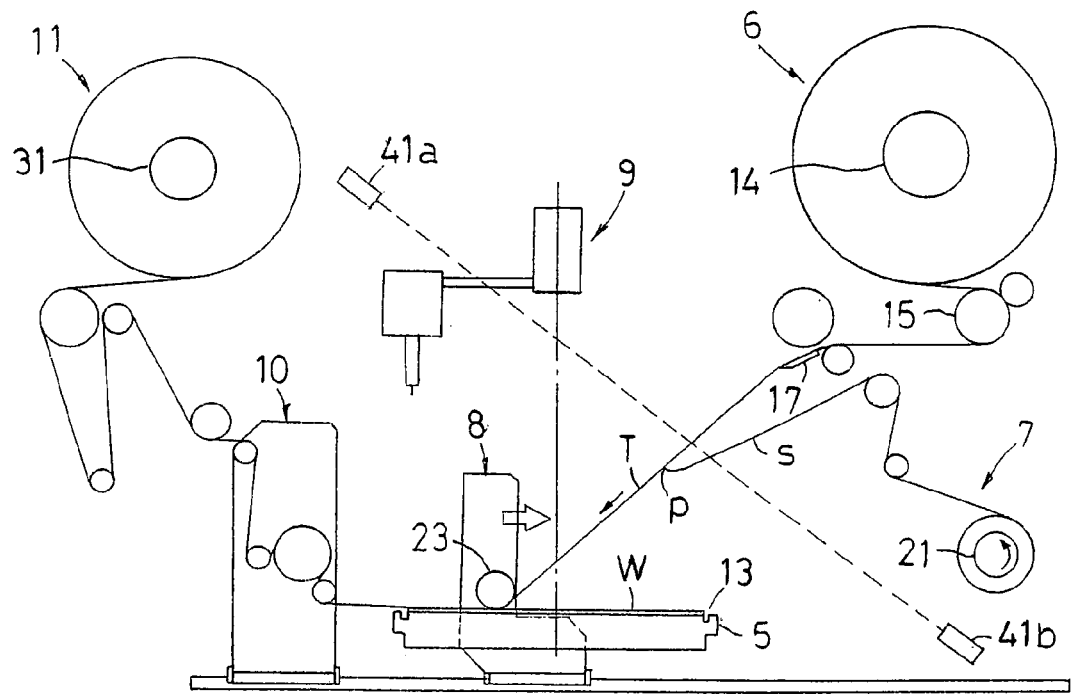
FIG. 3 is a front view illustrating a process for applying a protective tape.

Next, as illustrated in FIG. 3, the application roller 23 descends, and simultaneously the application unit 8 advances. At this time, the application roller 23 rolls ahead (right in the figure), while pressing the protective tape T downward on the wafer W. The protective tape T is applied on the whole surface of the wafer W with this rolling motion.

Figure 4:
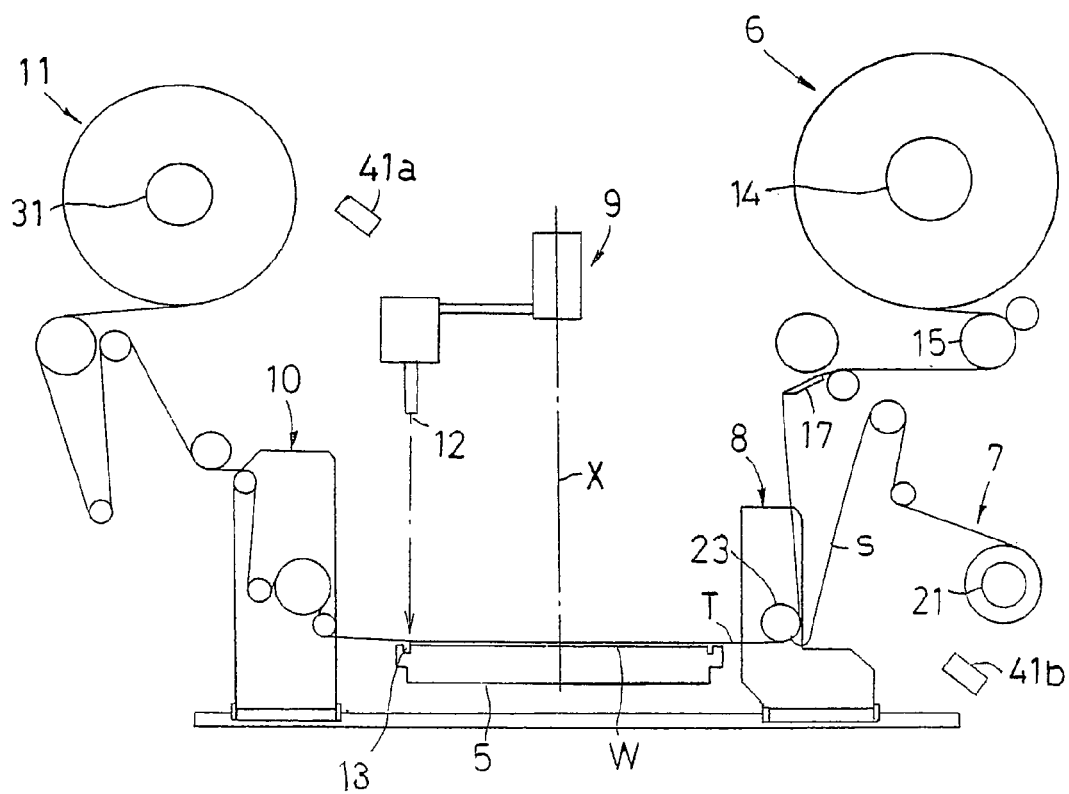
FIG. 4 is a front view illustrating a process for applying a protective tape.

As illustrated in FIG. 4, when the application unit 8 arrives at an end position beyond the chuck table 5, the cutter blade 12 that has been standing ready above descends. The cutter blade 12 is stuck into the protective tape T in a position of the cutter traveling groove 13 of the chuck table 5.

Figure 5:
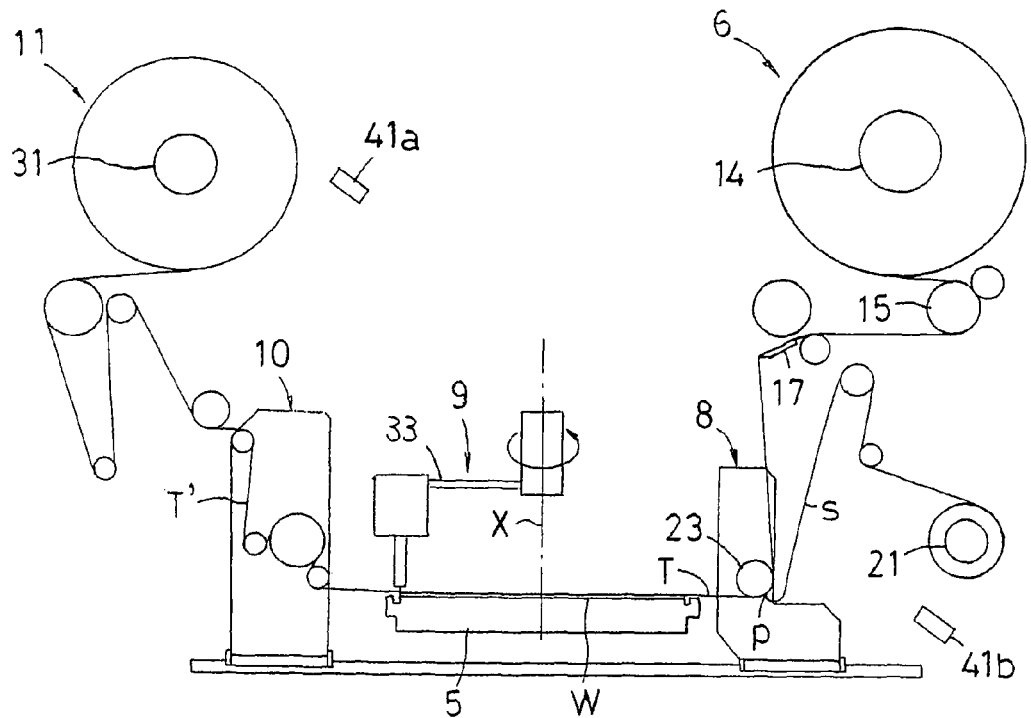
FIG. 5 is a front view illustrating a process for applying a protective tape.

As illustrated in FIG. 5, the cutter blade 12 descends to a position of predetermined cutting height, and halts. The support arm 33 rotates in the predetermined direction. The cutter blade 12 travels with rotation around the vertical axis center X accompanied by this rotation, and thereby the protective tape T is cut along with the contour of the wafer.

Figure 6:
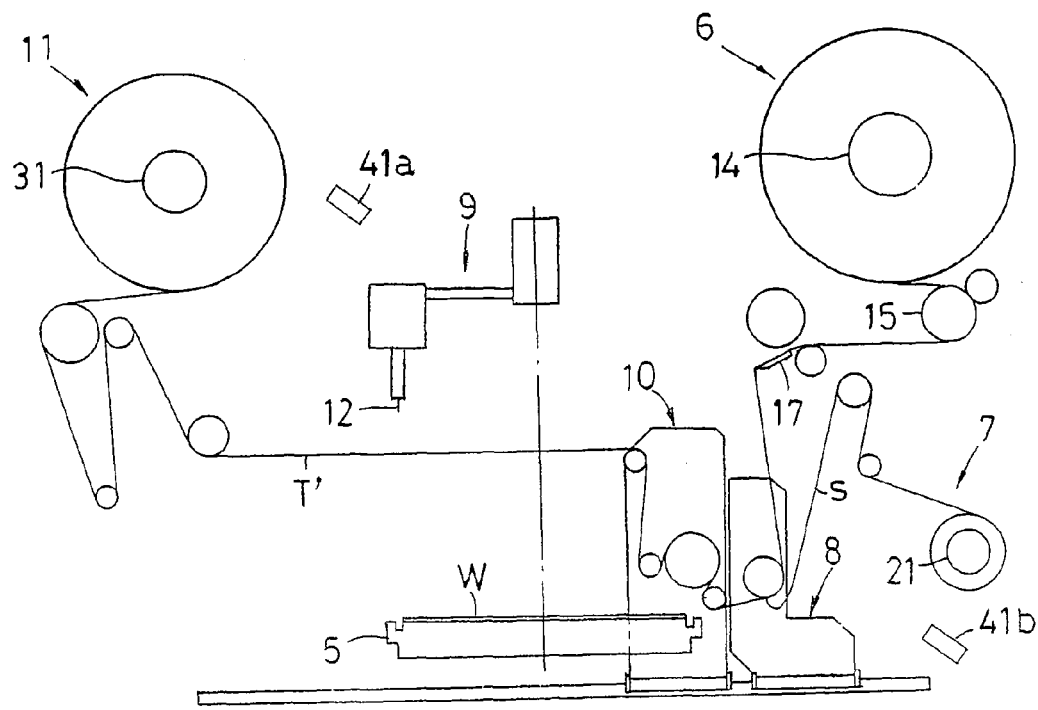
FIG. 6 is a front view illustrating a process for applying a protective tape.

After end of the cut of the sheet along with the outer circumferential edge of the wafer, as illustrated in FIG. 6, the cutter blade 12 ascends to an upper waiting position. Simultaneously, the separating unit 10 separates the unnecessary tape T' that has been cut and remained on the wafer W by winding, while moving forward.

Figure 7:
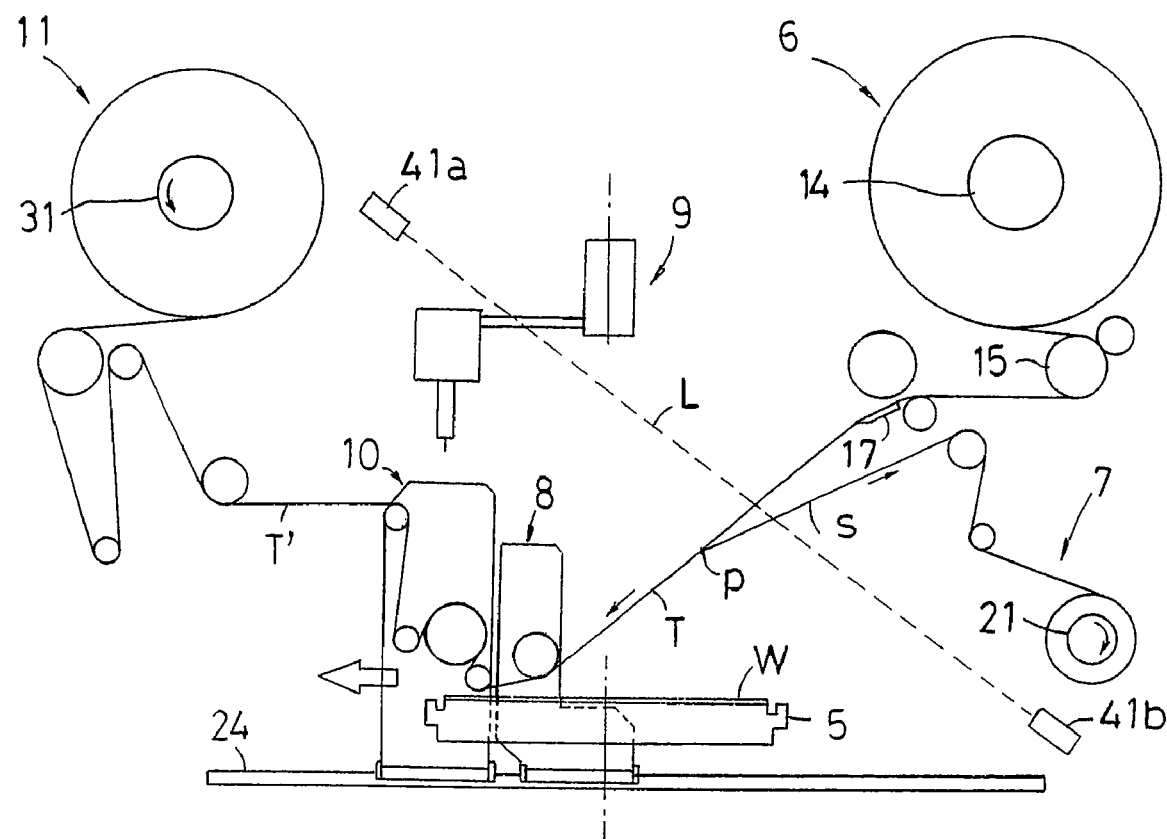
FIG. 7 is a front view illustrating a process for applying a protective tape.

When the separating unit 10 arrives at the end position of separating operation, the separating unit 10 and the application unit 8 move in an opposite direction to return to the initial position as illustrated in FIG. 7.

While the unnecessary tape T' is taken up by the collecting bobbin 20 at this time, a fixed amount of the protective tape T is delivered out from the tape feed section 6.

When the tape applying operation is completed, the sucking in the chuck table 5 is canceled. Subsequently, the wafer W after the application process is held and lifted with the suction-holding section 5a upward over the table, transported to the wafer holding section 2a of the robot arm 2, and then inserted into the cassette C of the wafer feeding/collecting section 1 for collection.

In this manner, one cycle of the tape applying process is completed. After that, the above-described operation will sequentially be repeated.

In the above-described protective tape applying process, after halt of travel of the protective tape T, a cloudy line mark resulting from halt of separation are formed at a separating point p of the separation of the separator s, on a pressure sensitive adhesive face of the protective tape T. In order to avoid overlapping attachment of the mark onto the surface of the next wafer W, the separator collection control is performed in the following manner corresponding to the tape application operation.

That is, at a point of start of application illustrated in FIG. 2, the separating point p of the separator s is in a predetermined position delivered ahead of the separating guide bar 17. This predetermined position is set in a position where application of the following protective tape T to the wafer W does not give the mark that is to be remained at the separating point p to the wafer surface.

In the start of tape application, the collecting bobbin 21 of the separator collecting section 7 is controlled to reverse in a direction of delivery of the separator s, following taking out of the protective tape T. This control allows traveling of the separator s with protective tape T in the same direction without separation.

After end of application, during cutting process of the tape and separating process of the unnecessary tape T' are performed, the separating point p does not move on the protective tape T. At this time, the cloudy line mark remains in the separating point p of the pressure sensitive adhesive face of the protective tape T.

Subsequently, the separating unit 10 and the application unit 8 move in the opposite direction, and return to the initial position. At this time, the protective tape T is delivered out from the sheet feed section 6 simultaneously with the operation of rolling up collection of the collecting bobbin 31, and the protective tape T is supplied over the chuck table 5. In this tape supplying process, the collecting bobbin 21 of the separator collecting section 7 rotates with control in the rolling up direction, and separation of the separator s is resumed, accompanied by simultaneous move of the separating point p.

Here, a transmission type photo sensor 41 having a projector 41a and a photo detector 41b in the upper and lower sides of the feed route of the protective tape T are arranged. This photo sensor 41 is connected to a control device 42. The optical axis L of this photo sensor 41 is set to intersect with the tape feed route at a predetermined position p in the application start. That is, when the separating point p that moves by rolling up of the separator s meets with the optical axis L of the photosensor 41, the light income in the photo detector 41b will decrease. This phenomenon leads to detection of arrival to the separating point p. This detection information stops rotation of the collecting bobbin 21, and stops rolling up of the separator s.

As a result, at a point of application start, as illustrated in FIG. 2, the mark of separation stop that remains at the separating point p will be located in a predetermined position avoiding application to the wafer surface.

In addition, variation of the angle of the projector 41a, and variation of a position and of the angle of the photodetector 41b in forward and backward directions allow forward and backward adjustment of the optical axis L of the photo sensor 41. This adjustment, corresponding to the size of the wafer W, allows adjustment of a position of the separating point p at the point of time of the tape stop.

When application of the protective tape T onto the surface of wafer W is completed as described above, the protective tape cutting process is performed along with the periphery of the wafer by the apparatus for cutting the protective tape 9. Here, in the case of this example, the apparatus for cutting the protective tape 9 is equipped with a tape tensioning device in order to improve finish of the cutting. Some of these examples will be illustrated hereinafter.

Example 1

Figure 9:
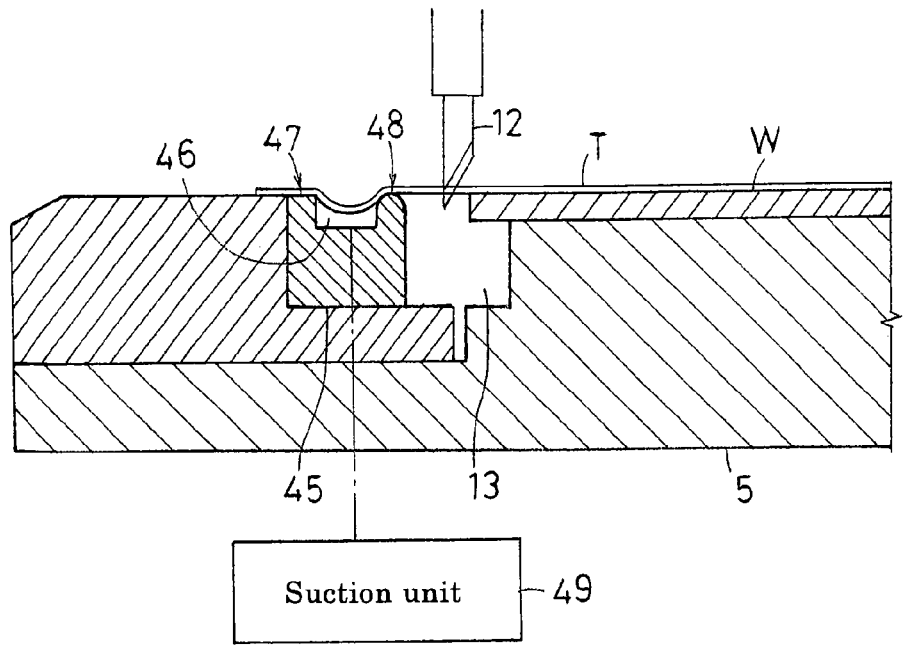
FIG. 9 is a sectional drawing illustrating tape tensioning device of example 1.
Figure 10:
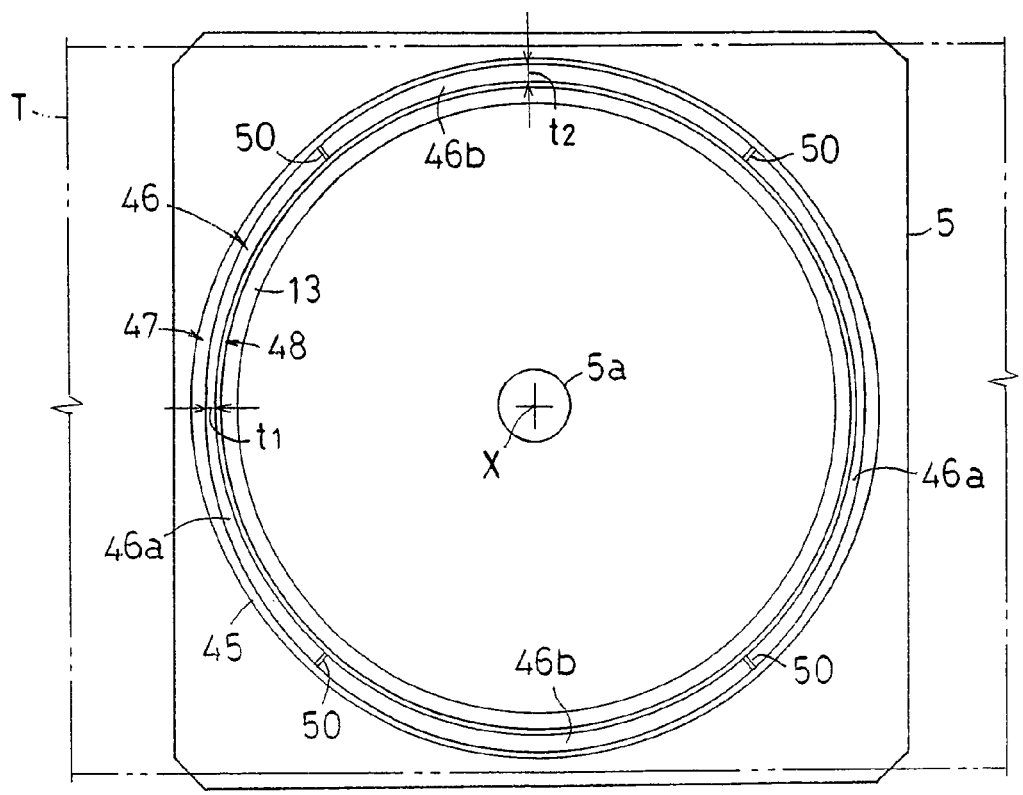
FIG. 10 is a plan view of a chuck table in example 1.

FIGS. 8 to 10 illustrates example 1 of a tape tensioning device. As illustrated in FIG. 8 and FIG. 9, a traveling groove for a cutter 13 formed on a top face of a chuck table 5 has a diameter of an inner circumference set somewhat smaller than the outside diameter of a wafer W. Accordingly, the wafer W is mounted so that the outer peripheral part of the wafer W may somewhat project from the traveling groove for the cutter 13.

The outer peripheral part, to which a protective tape T strongly applied, of the traveling groove for the cutter 13 has a ring member 45 disposed therein, as illustrated in FIG. 9. This ring member 45 is formed with stainless steel or aluminum materials.

The top face of this ring member 45 is set to give approximately the same height as the height of the surface of the wafer W mounted on the table. Furthermore, the outside diameter is set so that the protective tape T projecting from the wafer W may be applied over the outer edge of the ring member 45.

A depression 46 for catching the tape is annularly formed on the top face of the ring member 45. There are formed, on the outside top face of this depression 46, a tape holding section 47 for fixing and holding the outer edge of the protective tape T with intense application, and a tape supporting section 48 for catching and supporting the protective tape T with an annular projected part having a small width formed between the depression 46 and the traveling groove for the cutter 13 in a diameter direction. The top face of this tape supporting section 48 has a convex projection, and simultaneously the surface thereof is formed with materials having low adhesive property, such as silicone resins. In addition, the tape supporting section 48 has a coating formed of, for example, fluorine resins, sands, etc. for catching and supporting at the same level as that of the surface of the wafer, avoiding intense adhesion to the protective tape T.

The depression 46 is communicatively connected to a suction unit 49 for allowing application of a negative pressure to the depression 46.

With this configuration, application process of the protective tape T to the surface of the wafer W allows simultaneous application of the protective tape T projected from the periphery of the wafer W to the top face of the ring member 45. At this time, the protective tape T is strongly applied onto the tape holding section 47 of the ring member 45, providing a condition of having been caught and supported by the tape supporting section 48.

In this condition, application of a moderate negative pressure to the depression 46 by the operation of the suction unit 49 deforms and draws the protective tape T into the depression 46, as illustrated in FIG. 9. Here, since the outer edge of the protective tape T is adhered to the tape holding section 47 and is held, the protective tape T will be drawn outside in a diameter direction. That is, the part of the tape is stretched with the traveling groove for the cutter 13 with a tension, providing a condition without wrinkles and wavy shape. The cutter blade 12 is stuck into this tensioned part and subsequently is run, resulting in excellent cutting of the edge of the tape.

Here, the pressing force following the rolling motion of the application roller 23 in the protective tape application process may apply the part of the protective tape projected outside in the back and forth direction of the tape application of the wafer W onto a table in a state with comparatively excellent tensioning. On the contrary, the part of the protective tape projected apart from the wafer W in the width direction (hereinafter, referred to as right and left direction) of the tape is often applied on the table, somewhat relaxed. In such a case, it is desirable to apply larger (stronger) tension and stretch to the projected part of the protective tape in the right and left outside direction of the wafer W than the tension and stretch in the protective tape part projected in the front and rear direction.

The example of a configuration satisfying such a demand is illustrated in FIG. 10. In this example, the depression 46 has a larger groove width t2 in the right and left part than a groove width t1 in the front and rear part in the direction of tape application (right and left direction in FIG. 10). Furthermore, the depression 46 is divided into front and rear, right and left sectioned depressions 46a and 46b with partitions 50 that are provided in four parts in a circumferential direction, and is connected to a suction unit 49 for applying a negative pressure more intense than the negative pressure in the front and rear sectioned depression 46a to the right and left sectioned depression 46b. This configuration allows cutting with a uniform and suitable tension for the protective tape T in the traveling groove for the cutter 13 all over the peripheries of the wafer W.

Example 2

Figure 11:
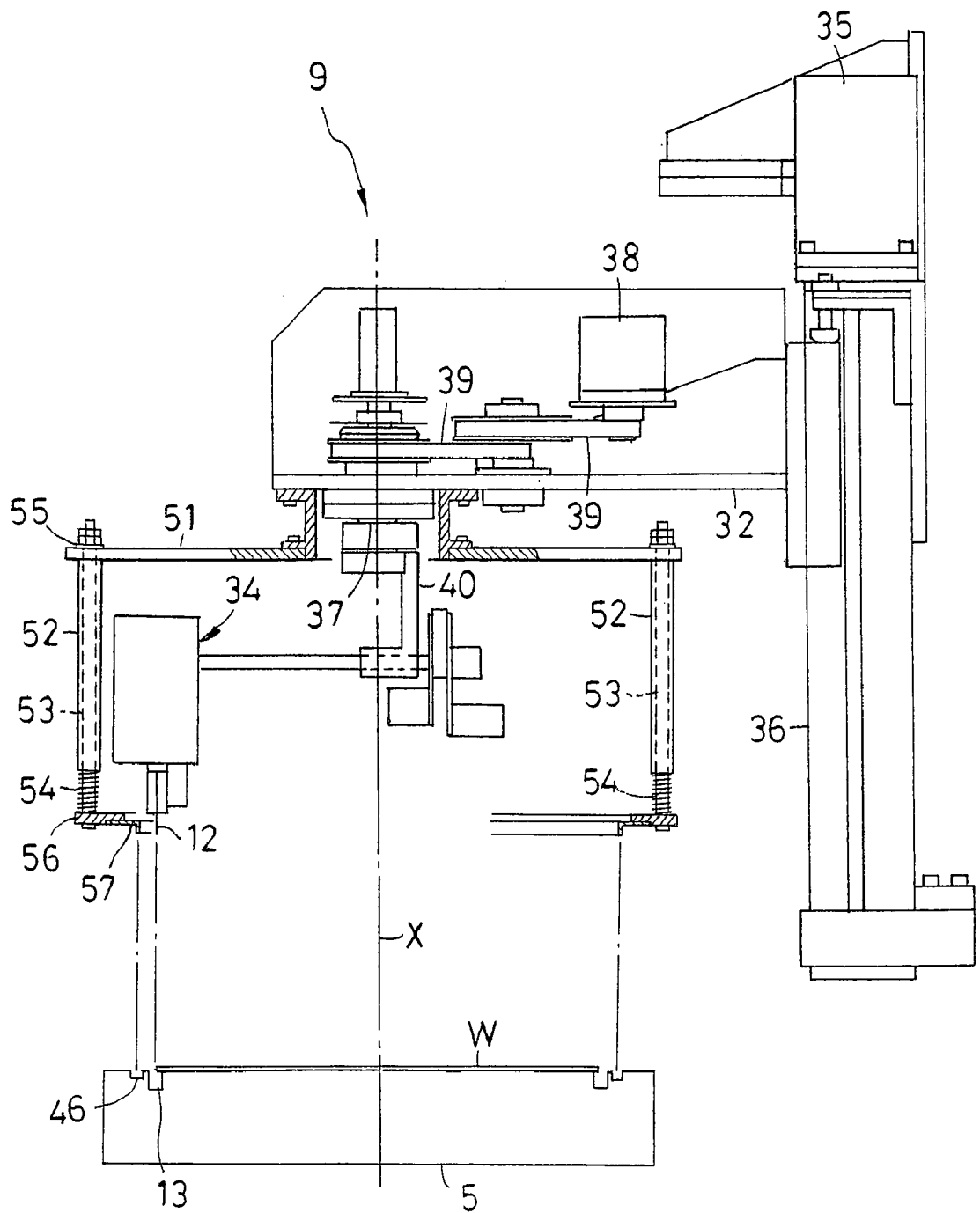
FIG. 11 is a front view of an apparatus for cutting a tape provided with a tape tensioning device of example 2.
Figure 12:
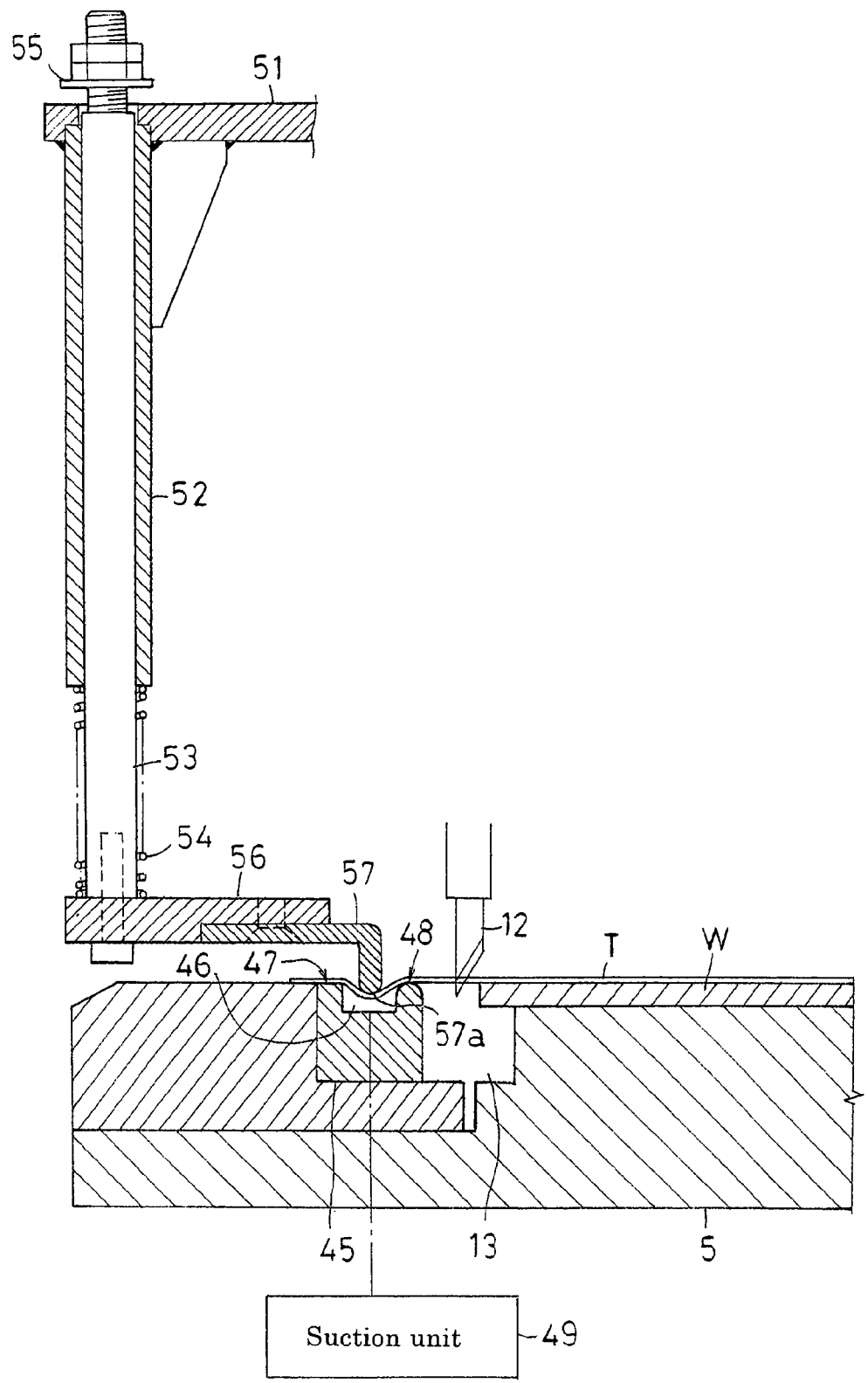
FIG. 12 is a sectional view illustrating a tape tensioning device of example 2.

FIG. 11 and FIG. 12 illustrate the second example of a tape tensioning device.

A chuck table 5 in this example has the same configuration as that of the example 1. That is, an annular depression 46 is formed through a ring member 45, and a tape holding section 47 and a tape supporting section 48 is formed in an outside and inside part of the depression 46. Furthermore, the depression 46 is communicatively connected with a suction unit 49.

A support plate 51 is fixed under a movable base 32 for ascending and descending a cutter blade 12. Spindles 53 are vertically and slidably inserted to guide tubes 52 suspended from three or four points in the circumferential direction of this support plate 51. Each spindle 53 is moderately biased downward with a spring 54 attached from outside, and limitation of the lowering position thereof is controlled with a stopper 55 that is equipped on the top end of the spindle 53 for allowing a position adjustment. A ring stay 56 is extended to connect the lower end of each spindle 53. A ring shape pressing member 57 is detachably linked with this ring stay 56.

As illustrated in FIG. 12, the pressing member 57 is formed so that a pressing part 57a bent downward from an inner circumference thereof may extend to the depression 46, and the lower end of the pressing part 57a has a curved projection.

In a waiting state wherein the movable base 32 is in an ascending position, the lower end of the pressing member 57 in the limit of lowering exists in a position somewhat lower than the end of the cutter blade 12. When the movable base 32 descends, the pressing member 57 deforms and presses the protective tape T into the depression 46 before sticking by the cutter blade 12. In this case, when the protective tape T reaches the limit of deformation, lowering of the pressing member 57 will be prevented. Further descending stroke of the movable base 32 will be absorbed by the upward slide of the spindle 53 against the spring 54, owing to the stick of the cutter blade 12.

Since the outer edge of the tape is applied on the tape holding section 47, when the protective tape T is deformed and pressed into the depression 46, the protective tape T is drawn outside in a diameter direction. That is, the part of the tape stretched on the traveling groove for the cutter 13 will be tensioned without wrinkles and wavy shape. The cutter blade 12 is stuck into this tensioned part, and rotates, resulting in excellent finish of the cut edge of the tape.

Example 3

Figure 13:
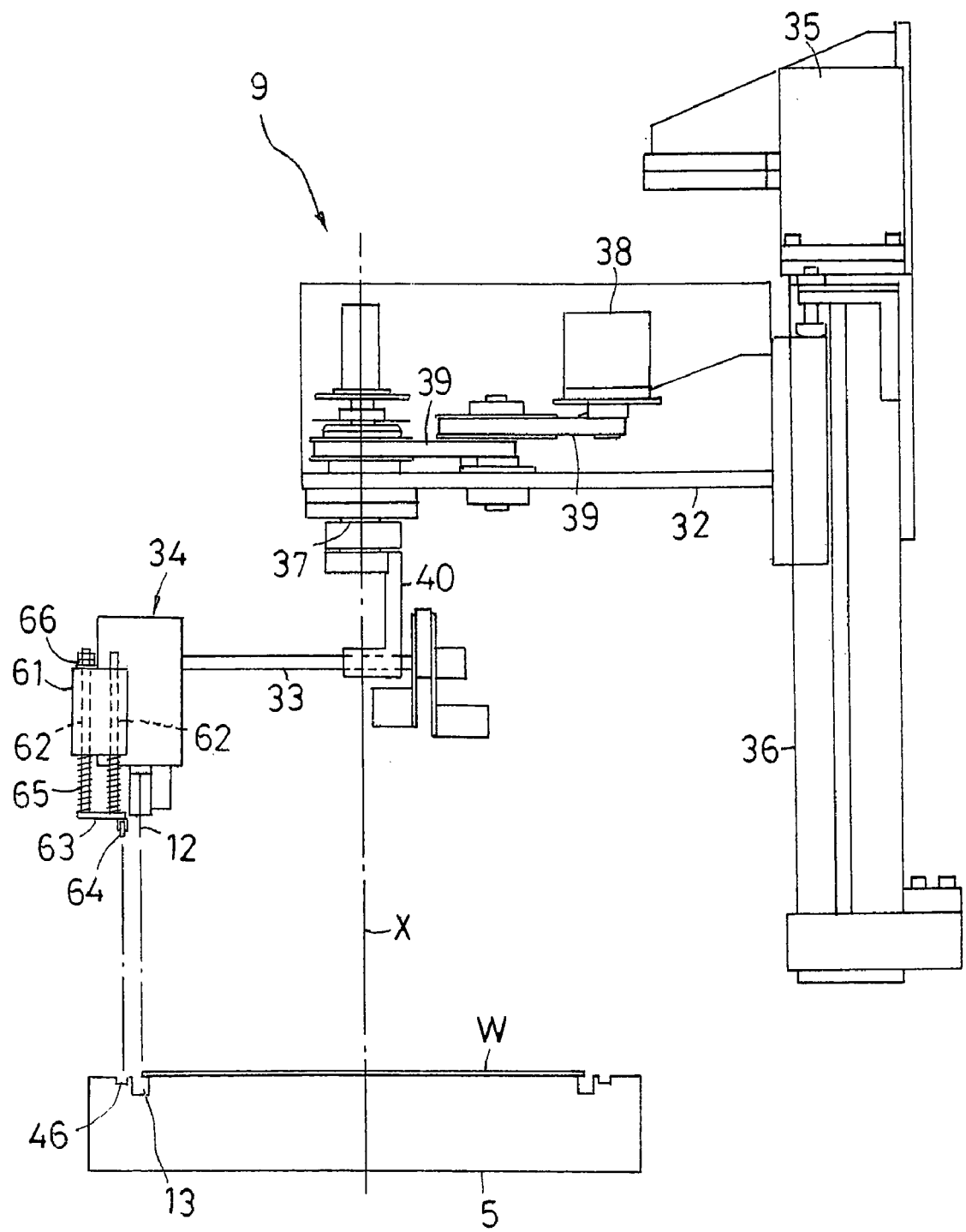
FIG. 13 is a front view of an apparatus for cutting a tape provided with a tape tensioning device of example 3.
Figure 14:
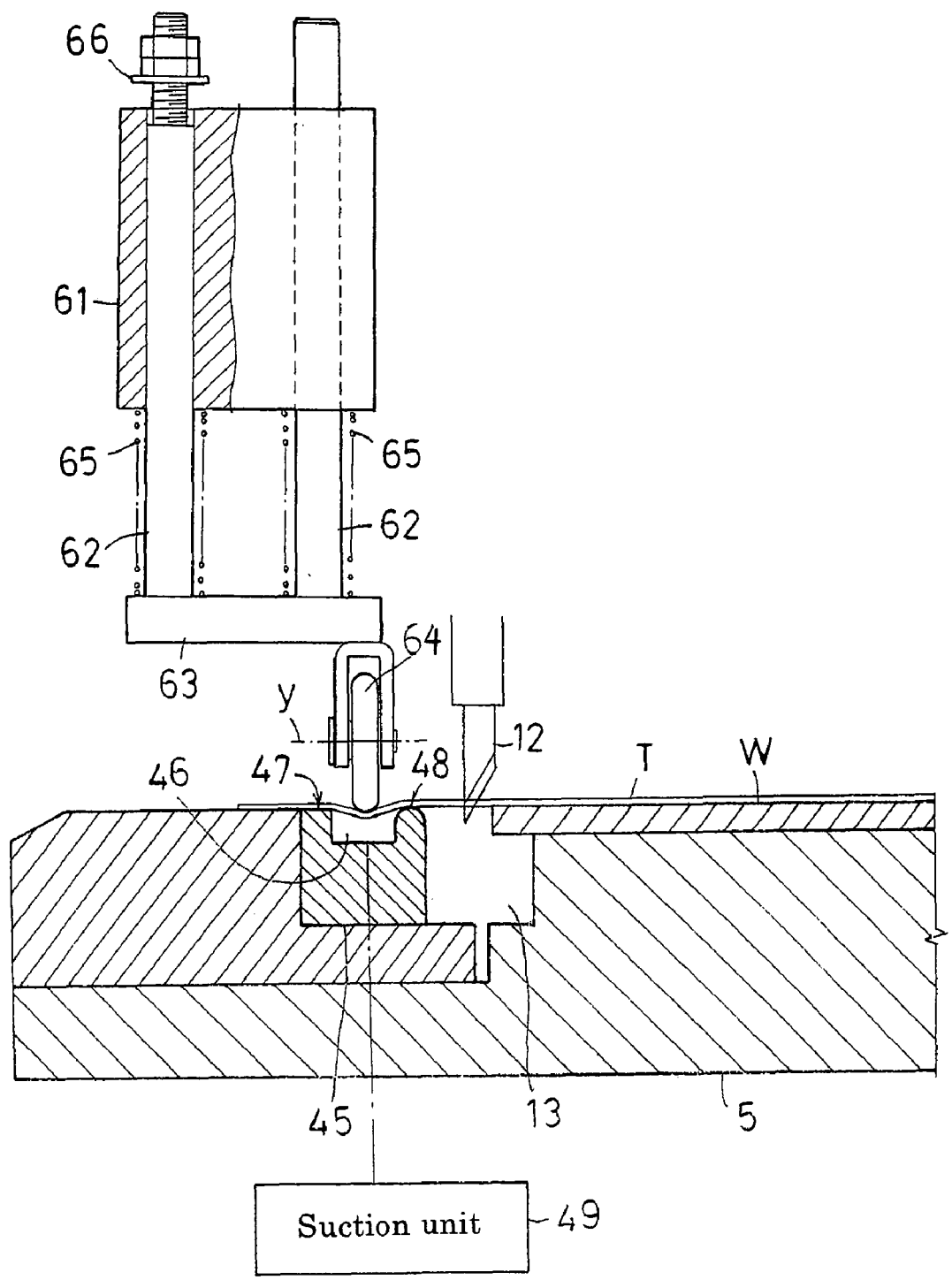
FIG. 14 is a sectional view illustrating a tape tensioning device of example 3.
Figure 15:
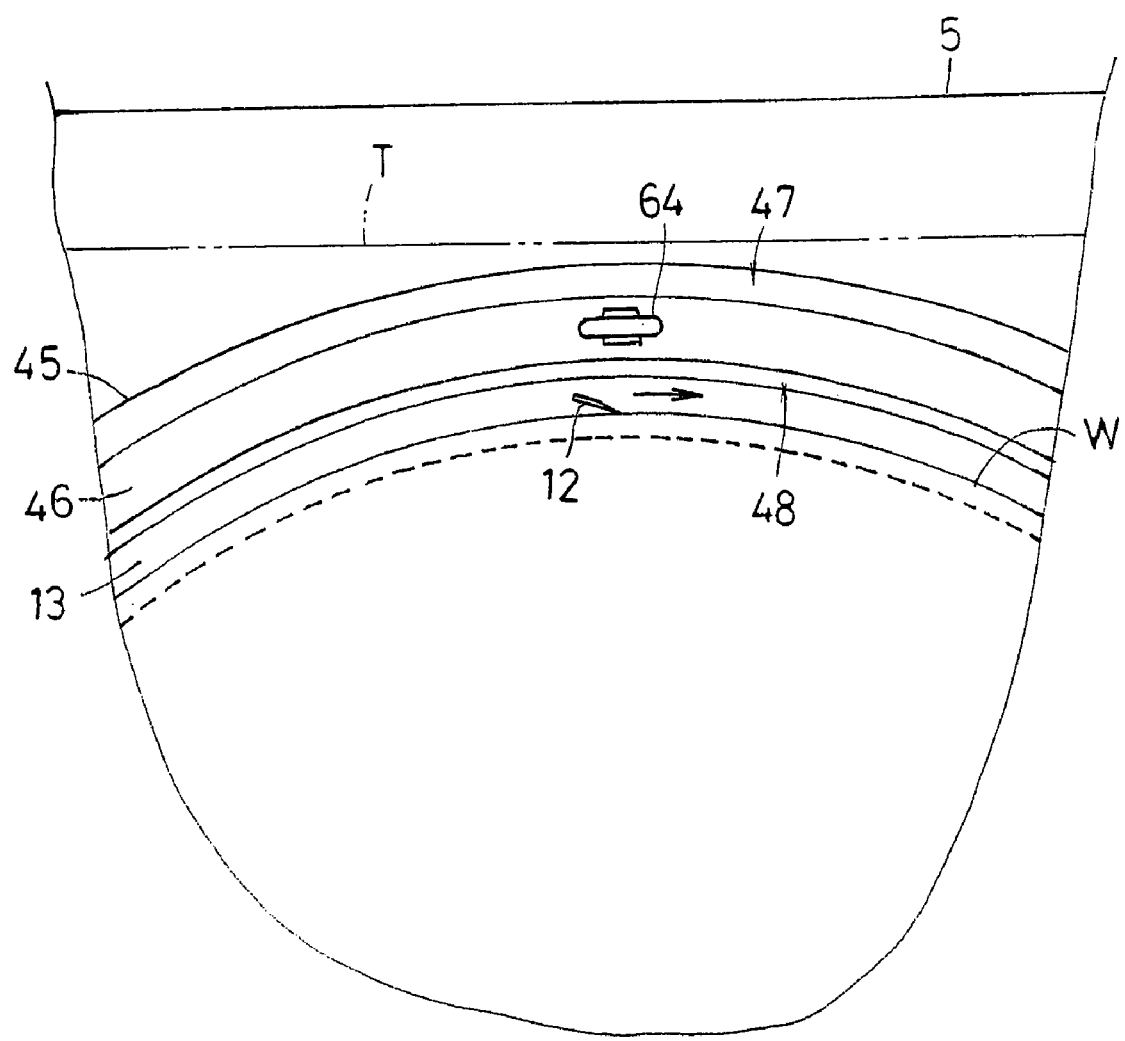
FIG. 15 is plan view illustrating a principal part of example 3.

FIGS. 13 to 15 illustrate example 3 of the tape tensioning device.

A chuck table 5 in this example has the same configuration as that in the example 1. That is, while an annular depression 46 is formed through a ring member 45, a tape holding section 47 and a tape supporting section 48 are formed in an outside and inside part of a depression 46. Furthermore, the depression 46 is communicatively connected with a suction unit 49.

As illustrated in FIG. 13 and FIG. 15, a bracket 61 is fixed to a cutter unit 34 in an apparatus for cutting the tape 9. A pair of spindles 62 is vertically and slidably inserted into this bracket 61. A pressing roller 64 idling around a horizontal axis center Y that intersects with a vertical axis center X is equipped to a support component 63 extending between the lower ends of both the spindles 62. Each spindle 62 is moderately biased downward with a spring 65 attached from outside, and limitation of the lowering position thereof is controlled with a stopper 66 that is equipped on the top end of one of the spindles 62 for allowing a position adjustment.

A pressing roller 64 has a width smaller than the width of the depression 46. That is, the pressing roller 64 is disposed so as to face to the center in a width direction of the depression 46, and at the same time the peripheral surface has a curved projection.

According to this configuration, when the protective tape T is applied on the surface of a wafer W, the protective tape T projected from the periphery of the wafer W is applied also on the top face of the ring member 45. At this time, the protective tape T is strongly applied on the tape holding section 47 in the ring member 45, and is supported by the tape supporting section 48 in a condition being caught. In this condition, a light negative pressure is applied to the depression 46 by the operation of a suction unit 49, and the protective tape T is somewhat deformed and drawn into the depression 46. In a waiting state wherein the movable base 32 is in an ascending position, the lower end of the pressing roller 64 in the limit of lowering exists in a position somewhat lower than the end of a cutter blade 12. When a movable base 32 descends, the pressing roller 64 deforms and presses the protective tape T on the depression into the depression 46 before sticking by the cutter blade 12. In this case, when the protective tape T reaches the limit of deformation, lowering of the pressing roller 64 will be prevented. Further descending stroke of the movable base 32 will be absorbed by the upward slide of the spindle 62 against the spring 65, owing to the stick of the cutter blade 12.

Since the outer edge of the tape is applied on the tape holding section 47, when the protective tape T is deformed and pressed into the depression 46, the protective tape T will be drawn outside in a diameter direction. That is, as illustrated in FIG. 15, the part of the tape stretched on the traveling groove for the cutter 13 will be tensioned without wrinkles and wavy shape. The cutter blade 12 is stuck into this tensioned part and rotates, resulting in excellent finish of the cut edge of the tape.

The present invention may also be carried out with following configurations.

(1) In order to give the surface of the tape supporting section 48 lower adhesive property, the tape supporting section 48 itself may be formed with materials with lower adhesive property, such as silicone rubbers.

(2) The outer edge of the tape may be fixed and held with a force caused by attaching and absorption power by providing a vacuum sucking hole in the tape holding section 47.

(3) In the example 2, the pressing member 57 is divided into at least four sections of front and rear, right and left in a circumferential direction, and the divided partial arc-shaped parts of the pressing member may be biased downward, allowing independent vertical displacement. Thereby, the front and rear, and right and left parts of the protective tape T can individually be deformed and inserted with different deformations.

(4) In the above-described example 3, the pressing roller 64 is disposed in a front and rear position in the traveling direction of the cutter blade 12, and thereby a suitable tension for the protective tape can be applied in the cutting part of the tape.

(5) Although the cutter blade 12 rotatively travels with respect to the fixed chuck table 5 in the above-described example, the following configurations are also possible in the above-described example 1 and example 3. The cutter blade 12 is fixed, and the chuck table 5 is rotated, that is, the cutter blade 12 may run relatively along with the traveling groove for the cutter 13.

(6) In the above-described example 2 and example 3, the protective tape T may be pressed with the pressing member 57 or the pressing roller 64 while drawing the protective tape T into the depression 46 by operation of the suction unit 49.

(7) Although the widths of the sectioned depression 46a and 46b have different widths from that of the tape in the transportation direction in the above-described example 1, the following configuration is also possible. The depth of the sectioned depression 46b in the tape width direction is set deeper than the depth of the sectioned depression 46a, and at the same time a higher suction force is applied. In this configuration, the amount of drawing of the outer edge part of the protective tape T in the tape width direction can be larger, and thus the protective tape T may have a tensioned condition without wrinkles and wavy shape.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for cutting a protective tape of a semiconductor wafer, the apparatus cutting, along with a contour of the semiconductor wafer, the protective tape applied on the surface of the semiconductor wafer, by mounting and holding the semiconductor wafer on a holding table provided with a traveling groove for a cutter, and by rotating a cutter blade stuck into the traveling groove along with a periphery of the semiconductor, the apparatus comprising:
   a tape supporting section having a surface formed by a face having a low adhesive property with respect to the protective tape, the tape supporting section being provided between the traveling groove for the cutter and a depression to insert the protective tape;
   a tape holding section for holding and fixing an outer edge of the protective tape; and
   a tape tensioning device for deforming and inserting a projected part in an outside direction of the protective tape applied on the semiconductor wafer into the depression;
   wherein the tape holding section is separated from the tape supporting section by the depression.

2. The apparatus for cutting the protective tape of the semiconductor wafer according to claim 1, wherein
   the tape tensioning device deforms and draws the protective tape into the depression by negative pressure applied to the depression using connection of the depression with a suction unit.

3. The apparatus for cutting the protective tape of the semiconductor wafer according to claim 2, wherein the depression is formed by a plurality of sectioned depression divided into a plurality of sections in a circumferential direction so as to allow application of different negative pressures to each of the sectioned depressions.

4. The apparatus for cutting the protective tape of the semiconductor wafer according to claim 3, wherein
a depth of the section in a tape width direction of the depression is set deeper than a depth of the section in a transportation direction of the tape to give a larger inserted amount of the protective tape in the tape width direction.

5. The apparatus for cutting the protective tape of the semiconductor wafer according to claim 1, wherein
the tape tensioning device is provided with a pressing member disposed above the depression enabling free vertical movement, and thus descend of the pressing member deforms and inserts the protective tape into the depression.

6. The apparatus for cutting the protective tape of the semiconductor wafer according to claim 5, wherein
the depression has an annular form, and the pressing member is formed to give a ring stay shape to be inserted in the depression.

7. The apparatus for cutting the protective tape of the semiconductor wafer according to claim 1, wherein
the tape tensioning device is freely vertically movable over the depression in the vicinity of the cutter blade, is a pressing roller enabling rotating travel together with the cutter blade with respect to the holding table, and the tape tensioning device lowers the pressing roller, deforms and inserts the protective tape into the depression.

8. The apparatus for cutting the protective tape of the semiconductor wafer according to claim 1, wherein the pressing roller is disposed at least at a front side in a front side and a rear side in the advancing direction of the cutter blade.

* * * * *